(12) United States Patent
Riccobene (10) Patent No.: US 6,515,333 B1
(45) Date of Patent: Feb. 4, 2003

(54) REMOVAL OF HEAT FROM SOI DEVICE (75) Inventor: Concetta E. Riccobene, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/843,958

(22) Filed: Apr. 27, 2001

(51) Int. Cl.[7] .................. H01L 27/01; H01L 27/12; H01L 31/0392
(52) U.S. Cl. ............... 257/347; 438/149; 438/479; 438/517
(58) Field of Search ............... 257/347; 438/149, 438/479, 517

(56) References Cited

U.S. PATENT DOCUMENTS

| | | | |
|---|---|---|---|
| 6,121,661 A | * 9/2000 | Assaderaghi et al. | 257/347 |
| 6,190,985 B1 | * 2/2001 | Buynoski | 438/149 |
| 6,288,426 B1 | * 9/2001 | Gauthier, Jr. et al. | 257/347 |
| 2002/0008283 A1 | * 1/2002 | Ju | 257/347 |
| 2002/0033189 A1 | * 3/2002 | Macris | 136/203 |

* cited by examiner

*Primary Examiner*—David Nelms
*Assistant Examiner*—Andy Huynh
(74) *Attorney, Agent, or Firm*—Renner, Otto, Boisselle & Sklar (57) ABSTRACT

According to the invention, a silicon-on-insulator (SOI) device and a method of constructing the device is disclosed. The SOI device has a substrate with a BOX layer disposed on the upper surface of the substrate. The BOX has an upper surface and a cavity extending from the upper surface partially therein. An active layer is disposed on the upper surface of BOX layer and extends into the cavity.

9 Claims, 6 Drawing Sheets

REMOVAL OF HEAT FROM SOI DEVICE

TECHNICAL FIELD

The present invention relates generally to semiconductor-on-insulator (SOI) devices and to methods of forming the same and, more particularly, to SOI devices and methods for forming same which promote the removal of heat from the SOI devices.

BACKGROUND ART

Traditional semiconductor-on-insulator (SOI) integrated circuits typically have a silicon substrate with a buried oxide (BOX) layer disposed thereon. An active silicon layer is disposed on the opposite side of the BOX layer from the silicon substrate. Within the active silicon layer, active devices, such as transistors, are formed in active regions. The size and placement of the active regions are defined by shallow trench isolation (STI) regions. As a result of this arrangement, the active devices are isolated from the silicon substrate by the BOX layer. In addition, a body region of each SOI transistor does not have body contacts and is therefore "floating."

Such SOI structures offer potential advantages over bulk chips for the fabrication of high performance integrated circuits for digital circuitry. Such digital circuitry is typically made from partially-depleted metal oxide semiconductor field effect transistors (MOSFETs). These SOI structures provide a significant gain in performance by having lower parasitic capacitance (due to the insulator layer) and increased drain current due to the floating body charging effects. These performance gains result from: a) no connection being made to the channel region, and b) charging of the floating body providing access toward a majority of carriers which dynamically lowers the threshold voltage and increased drain current. Devices, such as metal oxide silicon field effect transistors (MOSFETs), have a number of advantages when formed on SOI wafers versus bulk silicon MOS transistors. These advantages include: reduced source/drain capacitance that results in improved speed performance at higher-operating frequencies; reduced $N^+$ to $P^+$ spacing and thus higher packing density due to ease of isolation; absence of latch-up; lower voltage applications; and higher "soft error" upset immunity (i.e., the immunity to the effects of alpha particle strikes).

Although there are significant advantages associated with SOI technology, there are some disadvantages as well. For example, poor heat removal from electrical devices on an SOI substrate is a significant disadvantage. Electrical devices generate heat, and the inability to remove or dissipate the heat results in poor and/or inconsistent performance of the electrical devices, or even in some instances device and/or substrate degradation.

The poor heat removal for electrical devices on SOI substrates is primarily because of the buried oxide insulation layer. More specifically, the buried oxide insulation layer has a markedly lower thermal conductivity than the thermal conductivity of conventional bulk silicon (typically used as semiconductor substrates), which typically surrounds semiconductor devices. For example, the thermal conductivity of silicon dioxide in the BOX layer is about 1.4 W/m° C. while the thermal conductivity of conventional bulk silicon is about 150 W/m° C. As a result, the buried oxide layer undesirably thermally insulates the electrical device region in SOI substrates.

In view of the aforementioned disadvantages, there is a need for SOI devices of improved quality, particularly SOI devices having improved heat removal characteristics, and more efficient methods of making such SOI devices.

SUMMARY OF THE INVENTION

According to the invention, a silicon-on-insulator (SOI) device comprises a substrate having a buried oxide layer (BOX) disposed on the upper surface of the substrate. The BOX has an upper surface and a cavity extending from the upper surface partially therein. An active layer is disposed on the BOX layer. The active layer extends into the cavity. In a conventional MOSFET or transistor formed on the active layer, there is a source, a drain, and a body disposed therebetween, wherein the body extends into and generally fills the cavity.

According to the invention, the cavity has a bottom surface spaced a distance "x" from the lower surface of the BOX layer and the BOX layer has a width "w", wherein "x" is less than "w". The bottom surface of the cavity is spaced a distance "x" of 100 Å to 500 Å from the lower surface of the BOX layer. Also, the distance "x" is from 10 percent to 25 percent of the width "w" of the BOX layer. Moreover, the width "w" of the BOX layer is from about 1000 Å to about 2000 Å.

According to the invention, a method of fabricating the silicon-on-insulator (SOI) device having a substrate with a lower surface of a buried oxide (BOX) layer disposed thereon is disclosed. The method comprising the steps of providing a silicon substrate with a BOX layer; depositing a nitride layer on surface of the BOX layer followed by depositing a gate mask layer on nitride layer; removing a central section of nitride layer where gate is to be located; stripping away the gate mask; controlled etching of the central section of the Box layer to form a cavity; and removing the first and second nitride regions.

Further according to the invention, the method includes the step of growing/depositing an active layer of silicon on the BOX layer whereby the active layer extends into the cavity. The method can include doping the active layer to form a source, a drain, and a body disposed therebetween so that the body extends into the cavity. The method can further including the steps of forming STI regions at opposite ends of the active layer; and depositing gate oxide on outer surface of the body and on the outer surface of the STI regions. Also, the method includes depositing the silicon using epitaxy.

According to the invention, a method is provided for fabricating an intermediate wafer used in the construction of a silicon-on-insulator (SOI) device having a silicon substrate with a lower surface of a buried oxide layer (BOX) disposed thereon. The method comprising the steps of: providing a silicon substrate with a BOX layer; depositing a nitride layer on surface of the BOX layer followed by depositing a gate mask layer on nitride layer; removing a central section of nitride layer where gate is to be located; stripping away the gate mask; controlled etching of the central section of the Box layer to form a cavity; and removing the first and second nitride regions.

BRIEF DESCRIPTION OF THE DRAWINGS

These and further features of the present invention will be apparent with reference to the following description and drawings, wherein:

FIG. 2 (incorporating FIG. 2A and FIG. 2B) is a flow chart illustrating method of fabricating the SOI device according to the present invention.

DISCLOSURE OF THE INVENTION

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Figure 1:
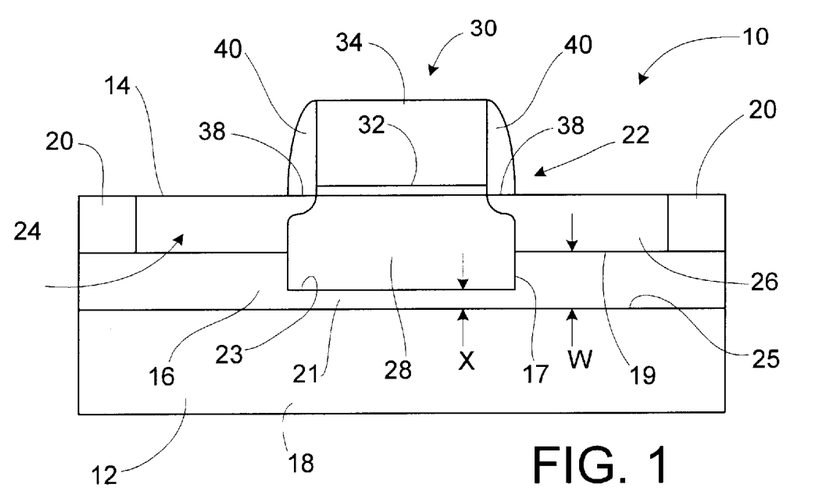
FIG. 1 is a cross-section of a semiconductor-on-insulator (SOI) device according to the present invention.

Referring to FIG. 1, a semiconductor-on-insulator (SOI) device 10 fabricated on an SOI wafer 12. The device 10 has an active layer 14 disposed on a buried oxide (BOX) layer 16 which in turn is disposed on conventional silicon substrate 18. The BOX layer 16 has a cavity 17 formed in the upper surface 19 of the BOX layer. A region 21 of the box layer 16 is disposed between the bottom surface 23 of the cavity and upper surface 25 of box layer 16 provides improved heat removal, as discussed hereinafter. While the device 10 is typically a transistor or as a partially-depleted metal oxide semiconductor field effect transistor (MOSFET), and is so referred to herein, the device 10 can include any type of electronics in the active layer 14 since it is the electronics of whatever type that generates the heat that the present invention is designed to reduce or more effectively remove.

In the illustrated embodiment, the active layer 14 is made from silicon, which may or may not be initially doped to form N or P channel devices. However, as one skilled in the art will appreciate, other semiconductor materials may be used with similar results. The BOX layer 16 is disposed on another semiconductor material of the conventional silicon substrate 18. Within the active layer 14, shallow trench isolation (STI) regions 20 define the placement of active regions 22 used for the fabrication of active devices, such as the device 10 described more fully below.

The device 10, as shown in FIG. 1, has the active layer extending into and filling the cavity 17. In a typical device 10, the active layer includes a source 24 and a drain 26 with a body 28, or channel disposed therebetween. Disposed on top of the body 28 is a gate 30. The gate 30 includes a layer of gate oxide 32 and a polysilicon gate portion 34, or is formed from another gate stack formation as are known in the art. The body 28 is disposed both in the active layer 14 as well as within the cavity 17 formed in the BOX layer 16. Moreover, the body 28 extends to the sidewalls of cavity 17 as well as to the bottom surface 23 so as to fill the cavity. Since, as discussed hereinbefore, the buried oxide insulation layer 16 has a markedly lower thermal conductivity than the conductivity of the convention silicon substrate 18, the heat buildup from the electrical devices in active region 22 is undesirably thermally insulated from the substrate 18. However, since the BOX layer 16 of the present invention incorporates a cavity 17 with a thin region 21 separating the body 28 from the substrate 18, heat generated in the electrical devices of active regions 22 can better dissipate the heat generated.

According to the present invention, the bottom surface 23 of the cavity 17 is spaced a distance "x" of 100 Å to 500 Å, and preferably a distance "x" of 200 Å to 300 Å from the lower surface 25 of the BOX layer 16. Moreover, the distance "x" is from 10% to 25%, and preferably a distance of from 18% to 22% of the width "w" of the BOX layer 16. If the distance "x" is less than 100 Å of Othe width of the BOX layer 16, then electrical isolation is impaired. Conversely, the distance "x" cannot be more than 500 Å of the width "w" of the BOX layer 16 because other of the advantages of the present invention would be minimal.

After the gate 30 has been formed, the source 24 and the drain 26 are doped to form extensions 38 using, for example, lightly doped drain (LDD) implants. Following extension 38 formation, sidewall spacers 40 are deposited adjacent to gate 30.

Figure 2A:
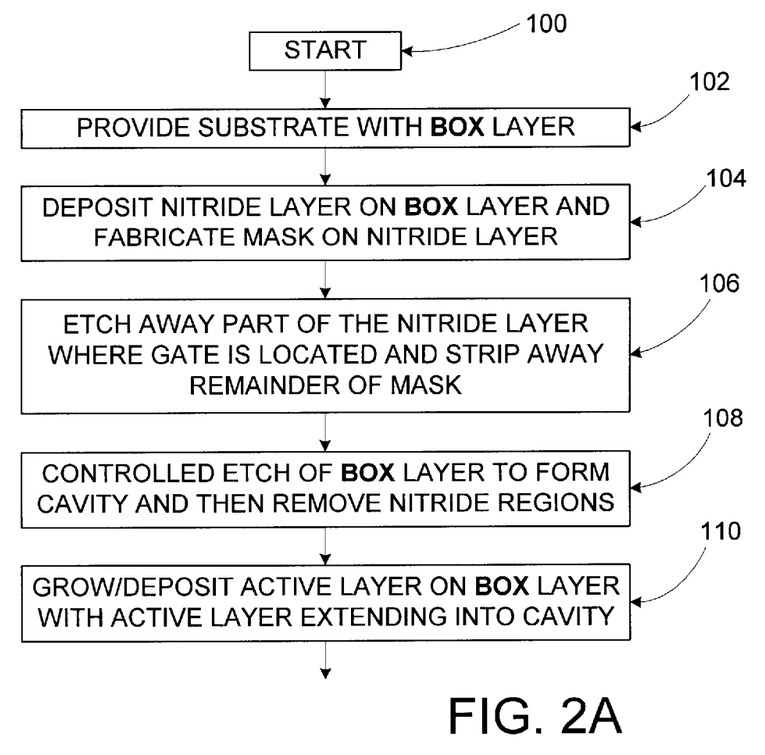
Figure 2B:
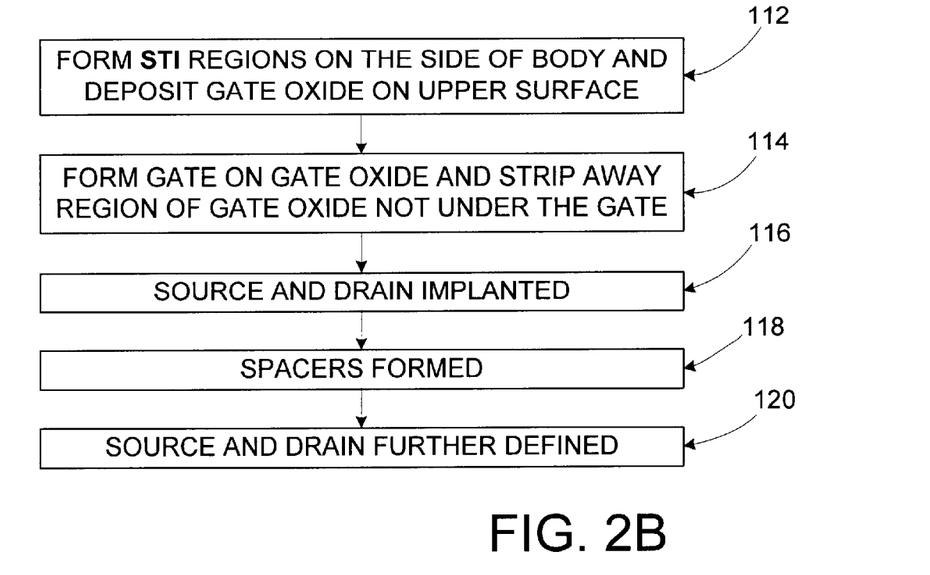
Figure 3A:
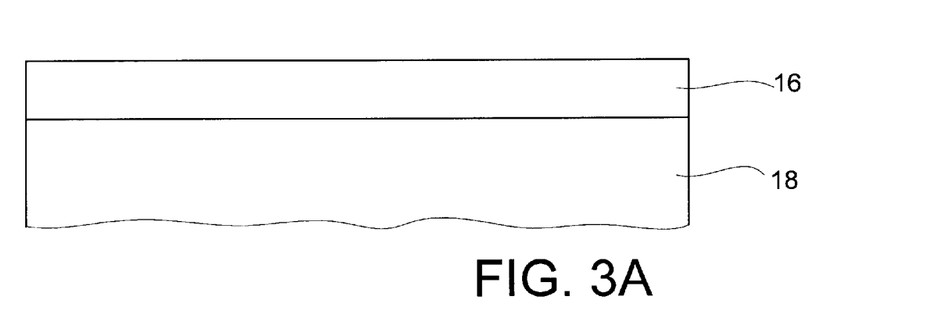
FIGS. 3A–3M are cross-sections of the SOI device according to the present invention in intermediate stages of fabrication.

Referring to FIGS. 2A and 2B, a method 100 of fabricating the device 10 illustrated in FIG. 1 is shown in flow-chart format. With additional reference to FIG. 3A, the method 100 begins in step 102 where a silicon substrate 18 with a buried oxide (BOX) layer 16, such as a thin silicon dioxide layer, is provided. The substrate 18 with the BOX layer 16 disposed thereon can be formed using convention techniques, such as SIMOX.

Figure 3B:
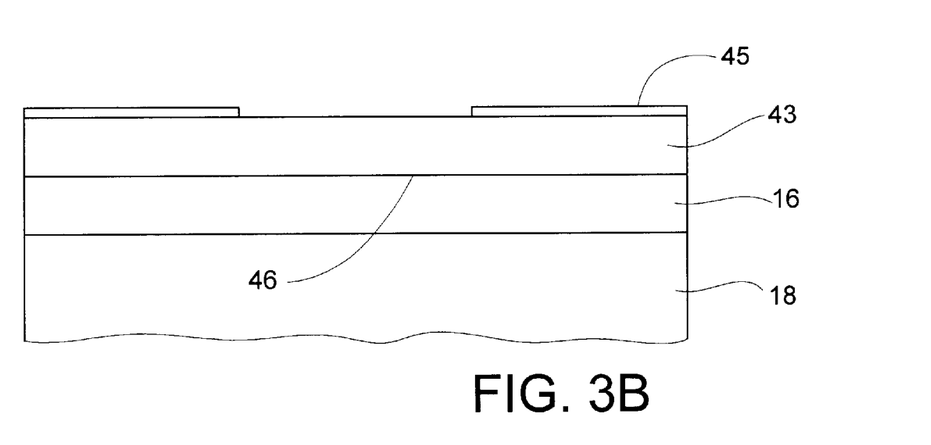
Figure 3C:
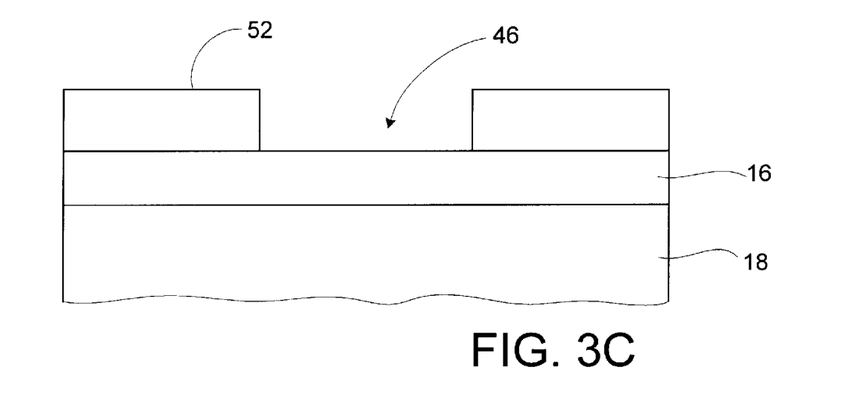
Figure 3D:
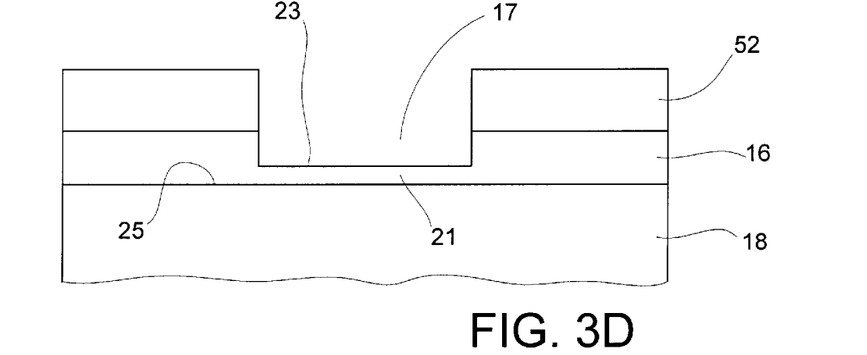
Figure 3E:
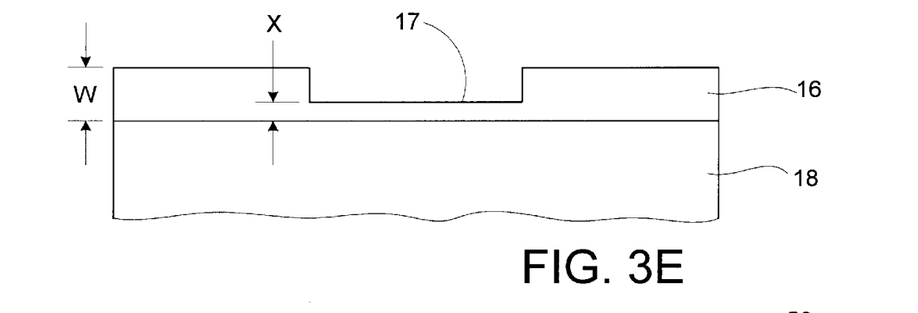
Figure 3F:
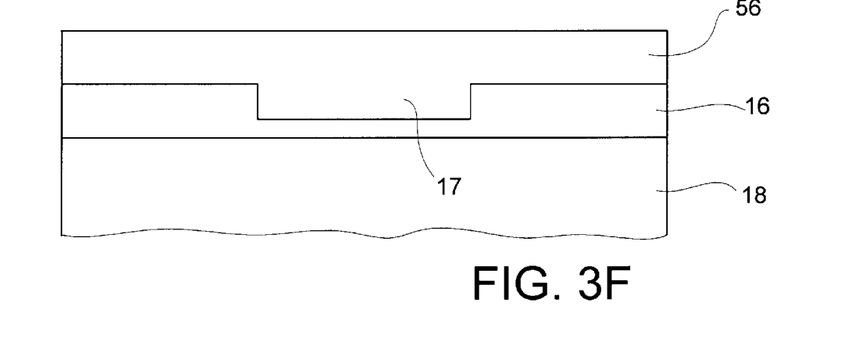
Figure 3G:
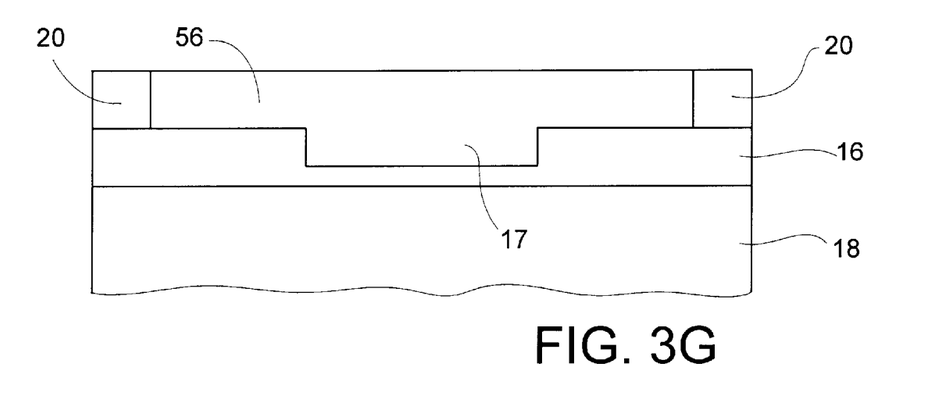

Next, in step 104, as shown in FIG. 3B, a nitride layer 43 is deposited cross the BOX layer 16. Then using conventional photolithographic techniques, mask 45 is fabricated on the surface of the nitride layer with openings in the regions where the gate of the transistors are to be fabricated. Continuing in step 106, as shown in FIG. 3C. a part of the nitride layer, where the gate is to be fabricated, is etched away and the gate mask is removed. Continuing, in step 108, as shown in FIG. 3D, a cavity 17 is formed with a controlled etch where the nitride regions 52 form a mask. By selectively etching away a portion of the BOX layer 16 below the central region 46, the cavity 17 is formed with a bottom surface 23. By using a controlled etch, the desired thickness of the cavity 17 between the bottom surface 23 and the lower surface 25 of the BOX layer can be achieved. That is, the controlled etch forms a thin region 21 in the BOX layer 16 between the cavity 17 and the lower surface 25 of the BOX layer 16. Moreover the narrow width "x" of the region 21 between the upper surface 23 of the cavity 17 and the upper surface 25 of the substrate 18 provides improved heat removal, as discussed hereinbefore. Following, the formation of the cavity 17, the nitride regions are removed by conventional processes, as shown in FIG. 3E, and included in step 108. Continuing with step 110, as shown in FIG. 3F, an active layer 56 is formed by conventional methods of growing/depositing the active layer, typically of silicon, on the BOX layer 16. The silicon is selectively grown or otherwise deposited, for example, with an epitaxy growth technique, and results in the upper layer 56 of silicon. The upper layer 56 of silicon is formed to have a thickness of about 500 Å to about 1500 Å. As illustrated in FIG. 3G, the upper layer of silicon 56 has one depth approximately equal to the maximum depth of the shallow trench isolation regions 20, and a deeper depth in the cavity 17.

Figure 3H:
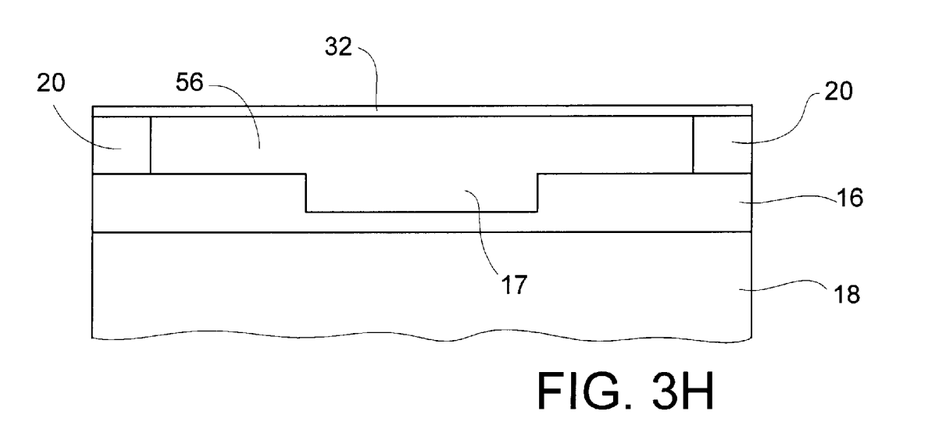

Next, in step 112, as shown in FIGS. 3G and 3H, the shallow trench isolation regions 20 are formed using conventional techniques. This is followed by doping the layer 56 and covering the upper surface of the doped body and the STI regions 20 with a gate oxide layer 32.

Figure 3I:
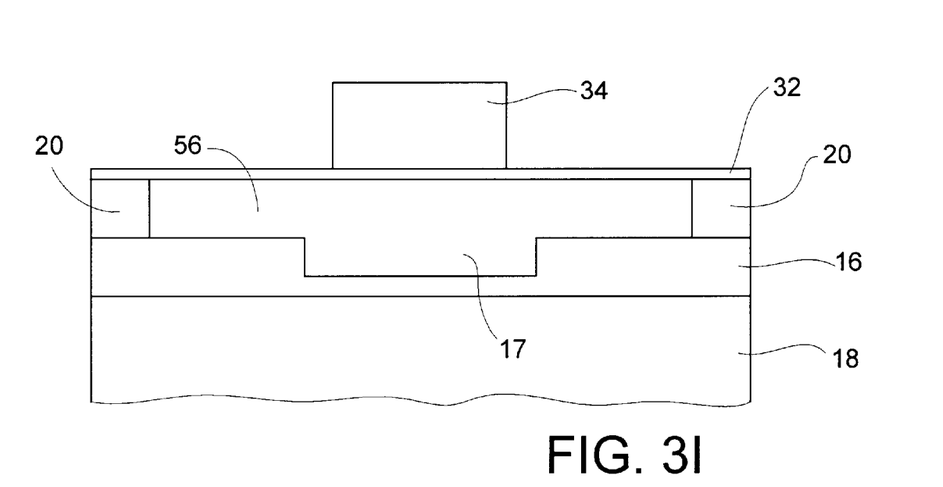
Figure 3J:
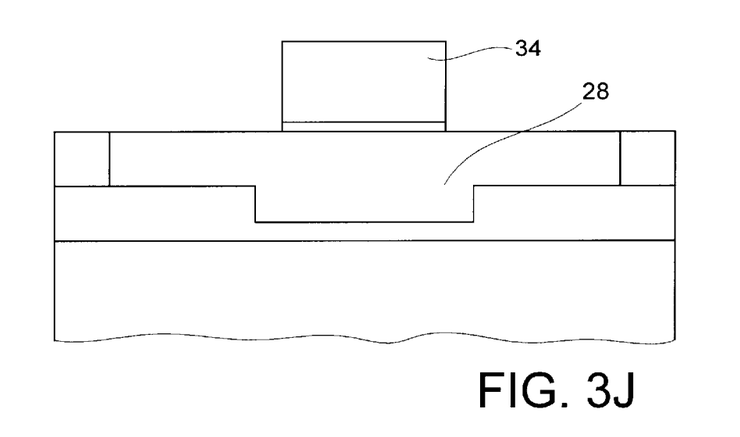

Continuing in step 114, as shown in FIGS. 3I and 3J, the gate 34 is deposited on the gate oxide layer 32 and then the portions of the oxide layer 32 that were not under the gate are removed (stripped away), so that the polysilicon gate portion 34, including any additional or alternative gate layers, can be formed using conventional techniques.

Figure 3K:
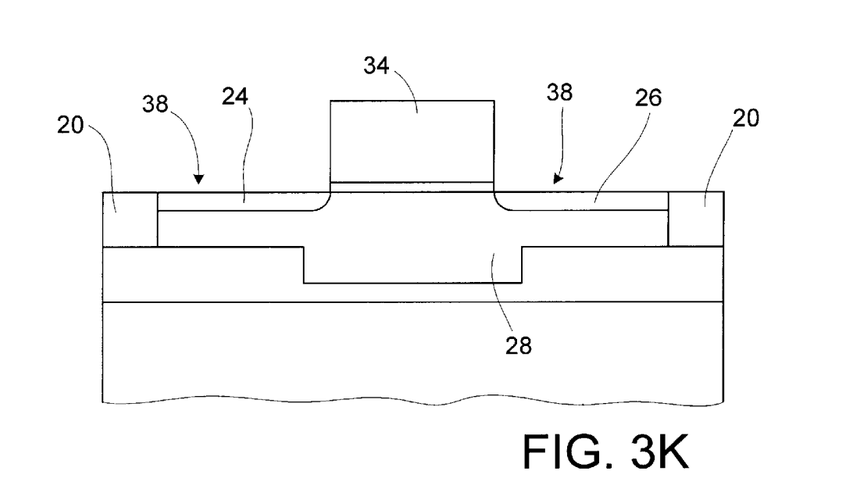

Next, in step 116, as shown in FIG. 3K, source and drain extensions 38 are implanted into the body 28. More specifically, a lightly doped drain (LDD) technique is employed to dope each of the source 24 and the drain 26. For an N-channel device, the extensions 38 are formed by implanting, for example, arsenic (As+) at an energy of about 1.0 kev to about 3.0 kev. For a P-channel device, the extensions 38 are formed by implanting, for example, boron (B+) at an energy of about 0.3 kev to about 1.5 kev. Regardless of the channel type, the implantation dose for the extensions 38 is, for example about $1 \times 10^{14}$ atoms/cm$^2$ to about $1 \times 10^{15}$ atoms/cm$^2$.

Figure 3L:
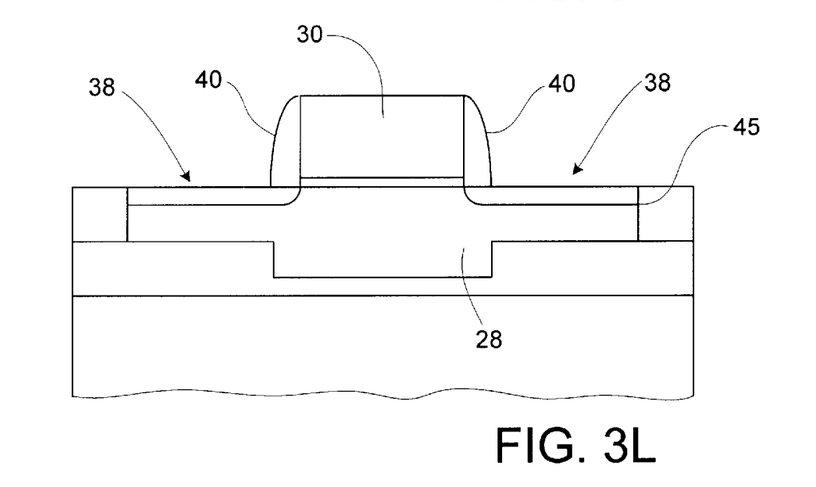

Next, in step 118, as shown in FIG. 3L, sidewall spacers 40 are formed adjacent to the gate 30. The spacers 40 are formed using conventional techniques and are made from a material such as silicon oxide (SiO$_2$) or a nitride (e.g. Si$_3$Na).

Figure 3M:
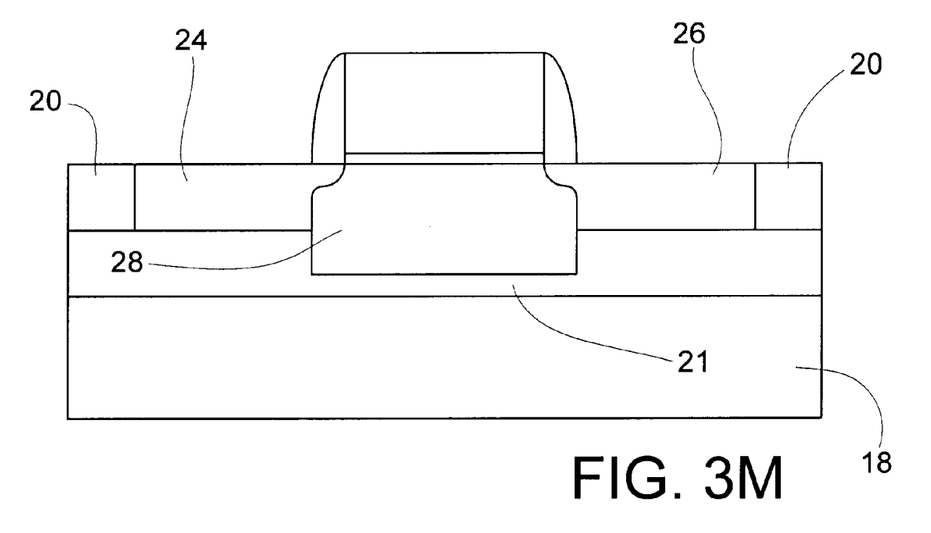

Next, in step 120, and as illustrated in FIGS. 1 and 3M, the source 24 and the drain 26 are further defined by source/drain deep implantation. For an N-channel device, the deep implantation can be made by implanting arsenic at, for example, an energy of about 5 kev to about 30 kev and a dose of about $4 \times 10^{15}$ atoms/cm$^2$. As on skilled in the art will appreciate, the source drain deep implantation, as well as formation of the source/drain extensions 38 described above, can be carried out using alternative dopants and/or other appropriate energy levels and dose levels, as is desirable for the device being fabricated. Following deep implantation in step 122, the wafer 12 is subjected to a thermal cycle, or rapid temperature anneal (RTA) at about 1,000° C. to about 1,050° C. for a period of about 5 seconds to about 30 seconds. In addition, other thermal cycles to recrystallize or amorphize the device 10 can be conducted as desired during the method 100.

The advantages of this structure are a) the increased active layer width, i.e., the silicon body 28, in which the heat generated by the current flow on the active can be distributed; and b) the rather thin layer 21 below the cavity in the BOX layer through which heat can easily transferred from the body to the substrate 18.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.) The terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A silicon-on-insulator (SOI) device, comprising:
    a substrate having a buried oxide layer (BOX) disposed on the upper surface of the substrate, the BOX having an upper surface and a cavity extending from the upper surface partially therein;
    an active layer disposed on the BOX layer, the active layer extending into the cavity.

2. The silicon-on-insulator (SOI) device according to claim 1 wherein the cavity has a bottom surface spaced a distance "x" from the lower surface of the BOX layer and the BOX layer has a width "w", wherein "x" is less than "w".

3. The silicon-on-insulator (SOI) device according to claim 2 wherein the active layer extends to the bottom surface of the cavity.

4. The silicon-on-insulator (SOI) device according to claim 3 wherein the active layer substantially fills the cavity to enhance heat transfer from a body within the active layer to the substrate.

5. The silicon-on-insulator (SOI) device according to claim 2 wherein the bottom surface of the cavity is spaced a distance "x" of 100 Å to 500 Å from the lower surface of the BOX layer.

6. The silicon-on-insulator (SOI) device according to claim 2 wherein the distance "x" is from 10 percent to 25 percent of the width "w" of the BOX layer.

7. The silicon-on-insulator (SOI) device according to claim 2 wherein the width "w" of the BOX is 1000 Å to 2000 Å.

8. The silicon-on-insulator (SOI) device according to claim 1 wherein the active layer has a source, a drain, and a body disposed therebetween, and the body extends into the cavity.

9. The silicon-on-insulator (SOI) device according to claim 1 wherein the body fills the cavity.

* * * * *

UNITED STATES PATENT AND TRADEMARK OFFICE
CERTIFICATE OF CORRECTION

PATENT NO.   : 6,515,333 B1
DATED        : February 4, 2003
INVENTOR(S)  : Riccobene It is certified that error appears in the above-identified patent and that said Letters Patent is hereby corrected as shown below:

Column 2,
Line 66, replace "illustrating method" with -- illustrating a method --

Column 3,
Line 67, replace "of Othe width" with -- of the width --

Column 4,
Line 19, replace "cross" with -- across --
Line 20, replace "techniques, mask" with -- techniques, a mask --

Signed and Sealed this

Twenty-second Day of April, 2003

JAMES E. ROGAN
*Director of the United States Patent and Trademark Office*